(12) United States Patent
Ishiwaki

(10) Patent No.: US 7,840,881 B2
(45) Date of Patent: Nov. 23, 2010

(54) COMMUNICATION SYSTEM

(75) Inventor: Masahiko Ishiwaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1014 days.

(21) Appl. No.: 11/609,935

(22) Filed: Dec. 13, 2006

(65) Prior Publication Data

US 2007/0198891 A1 Aug. 23, 2007

(30) Foreign Application Priority Data

Jan. 16, 2006 (JP) .............................. 2006-007538
Sep. 14, 2006 (JP) .............................. 2006-249443

(51) Int. Cl.
*H03M 13/00* (2006.01)
(52) U.S. Cl. ..................................... 714/781
(58) Field of Classification Search ................ 714/757, 714/758, 781, 799, 807
See application file for complete search history.

(56) References Cited

U.S. PATENT DOCUMENTS 5,247,524 A * 9/1993 Callon ......................... 714/807
5,671,238 A * 9/1997 Chen et al. ................... 714/757
7,174,498 B2 * 2/2007 Weissinger .................. 714/785

FOREIGN PATENT DOCUMENTS

JP 5-063682 A1 3/1993
JP 2002-335229 A1 11/2002
JP 2003-134092 A1 5/2003

OTHER PUBLICATIONS

Braun et al., Parallel CRC computation in FPGAs, Jan. 20, 2006, Springerlink vol. 1142/1996, p. 156-165.*
"Error detecting system-cyclic code", http://laputa.cs.shinshu-u.ac.jp/vizawa/InfSys1/advanced/crc/, Oct. 19, 2005.
"What is CRC and CRC's type", http://page.freett.com/seaside/vip/crc/DocCRC.htm, Oct. 19, 2005.
"Code theory", http://www.teu.ac.jp/tbin/class/coding/hugou.html, 10/189/2005.

* cited by examiner

*Primary Examiner*—Shelly A Chase
(74) *Attorney, Agent, or Firm*—Leydig, Voit & Mayer, Ltd.

(57) ABSTRACT

A communication system comprises a transmitting device and a receiving device. The transmitting device includes means for connecting an addition bit string containing at least one bit 1 to information data, means for generating a CRC code corresponding to a remainder at a polynomial ring on a Galois field defined modulo 2 based on a predetermined generator polynomial of the information data connected with the addition bit string, means for transmitting the information data connected with the CRC code. The receiving device includes means for receiving the data, means for performing an addition of the data received and the addition bit string at a polynomial ring on a Galois field defined modulo 2, means for making a decision as to the presence or absence of a transmission error by determining the remainder at the polynomial ring on the Galois field defined modulo 2 based on the generator polynomial of data.

10 Claims, 11 Drawing Sheets

FIG. 6

| 101+103 | | | | | | | | 108 | | |
|---|---|---|---|---|---|---|---|---|---|---|
| 1 | 2 | 3 | 4 | 5 | 6 | 7 | 8 | 1 | 2 | 3 |
| colspan the number of bits 1 is 8 | | | | | | | | 0 | 0 | 0 |
| the number of bits 1 is 7 | | | | | | | | 0 | 0 | 1 |
| the number of bits 1 is 6 | | | | | | | | 0 | 1 | 0 |
| the number of bits 1 is 5 | | | | | | | | 0 | 1 | 1 |
| the number of bits 1 is 4 | | | | | | | | 1 | 0 | 0 |
| the number of bits 1 is 3 | | | | | | | | 1 | 0 | 1 |
| the number of bits 1 is 2 | | | | | | | | 1 | 1 | 0 |
| the number of bits 1 is 1 | | | | | | | | 1 | 1 | 1 |
| the number of bits 1 is 0(all 0) | | | | | | | | It cannot express | | |

FIG. 7

| 101+103 | | | | | | | | 108 | | | all-0 expression bit |
|---|---|---|---|---|---|---|---|---|---|---|---|
| 1 | 2 | 3 | 4 | 5 | 6 | 7 | 8 | 1 | 2 | 3 | 4 |
| the number of bits 1 is 8 | | | | | | | | 0 | 0 | 0 | 0 |
| the number of bits 1 is 7 | | | | | | | | 0 | 0 | 1 | 0 |
| the number of bits 1 is 6 | | | | | | | | 0 | 1 | 0 | 0 |
| the number of bits 1 is 5 | | | | | | | | 0 | 1 | 1 | 0 |
| the number of bits 1 is 4 | | | | | | | | 1 | 0 | 0 | 0 |
| the number of bits 1 is 3 | | | | | | | | 1 | 0 | 1 | 0 |
| the number of bits 1 is 2 | | | | | | | | 1 | 1 | 0 | 0 |
| the number of bits 1 is 1 | | | | | | | | 1 | 1 | 1 | 0 |
| the number of bits 1 is 0(all 0) | | | | | | | | It cannot express | | | 1 |

FIG. 8

| | 101+103 | | | | | | | 108 | | |
|---|---|---|---|---|---|---|---|---|---|---|
| | 1 | 2 | 3 | 4 | 5 | 6 | 7 | 1 | 2 | 3 |
| the number of bits 1 is 7 | | | | | | | | 0 | 0 | 0 |
| the number of bits 1 is 6 | | | | | | | | 0 | 0 | 1 |
| the number of bits 1 is 5 | | | | | | | | 0 | 1 | 0 |
| the number of bits 1 is 4 | | | | | | | | 0 | 1 | 1 |
| the number of bits 1 is 3 | | | | | | | | 1 | 0 | 0 |
| the number of bits 1 is 2 | | | | | | | | 1 | 0 | 1 |
| the number of bits 1 is 1 | | | | | | | | 1 | 1 | 0 |
| the number of bits 1 is 0(all 0) | | | | | | | | 1 | 1 | 1 |

FIG. 9

| | 101+103 | | | | | | | | 108 | | | |
|---|---|---|---|---|---|---|---|---|---|---|---|---|
| | 1 | 2 | 3 | 4 | 5 | 6 | 7 | 8 | 1 | 2 | 3 | 4 |
| the number of bits 1 is 8 | | | | | | | | | 0 | 0 | 0 | 0 |
| the number of bits 1 is 7 | | | | | | | | | 0 | 0 | 0 | 1 |
| the number of bits 1 is 6 | | | | | | | | | 0 | 0 | 1 | 0 |
| the number of bits 1 is 5 | | | | | | | | | 0 | 0 | 1 | 1 |
| the number of bits 1 is 4 | | | | | | | | | 0 | 1 | 0 | 0 |
| the number of bits 1 is 3 | | | | | | | | | 0 | 1 | 0 | 1 |
| the number of bits 1 is 2 | | | | | | | | | 0 | 1 | 1 | 0 |
| the number of bits 1 is 1 | | | | | | | | | 0 | 1 | 1 | 1 |
| the number of bits 1 is 0(all 0) | | | | | | | | | 1 | 0 | 1 | 0 |

FIG. 10

| | | | 101+103 | | | | | | 108 | |
|---|---|---|---|---|---|---|---|---|---|---|
| 1 | 2 | 3 | 4 | 5 | 6 | 7 | 8 | 1 | 2 | 3 |
| the number of bits 1 is 8 ||||||||  0 | 0 | 0 |
| the number of bits 1 is 7 ||||||||  0 | 0 | 1 |
| the number of bits 1 is 6 ||||||||  0 | 1 | 0 |
| the number of bits 1 is 5 ||||||||  0 | 1 | 1 |
| the number of bits 1 is 4 ||||||||  1 | 0 | 0 |
| the number of bits 1 is 3 ||||||||  1 | 0 | 1 |
| the number of bits 1 is 2 ||||||||  1 | 1 | 0 |
| the number of bits 1 is 1 ||||||||  1 | 1 | 1 |
| the number of bits 1 is 0(all 0) ||||||||  1 | 1 | 1 |

COMMUNICATION SYSTEM

FIELD OF THE INVENTION

The present invention relates to a communication system that performs a CRC (Cyclic Redundancy Code) computation to detect the presence or absence of a transmission error during transfer of data.

BACKGROUND ART

In wireless communications or the like, a CRC computation has been widely used to detect the presence or absence of a transmission error on the receiving side (refer to, for example, Japanese Patent Laid-open No. 2003-134092).

In a communication system that performs the CRC computation, a transmitting device generates a CRC code, based on information data to be transmitted and transmits the information data (transmit data) connected with the CRC code. On the other hand, a receiving device performs a CRC computation, based on received data in parallel with the fetching of received data excluding the CRC code from the received data (receive data) to thereby detect the presence or absence of a transmission error.

The CRC computation will be described below in further detail. First, m-bit information data is defined as an m–1 order polynomial $A(x)=a_{m-1}x^{m-1}+a_{m-2}x^{m-2}+ \ldots +a_1x^1+a_0x^0$ using elements $a_{m-1}, a_{m-2}, \ldots, a_1, a_0$ of a Galois field GF(2) defined modulo 2. A remainder of order n–1 obtained by dividing $x^nA(x)$ by a generating or generator polynomial $G(x)$ of order n is defined as $R(x)=r_{n-1}x^{n-1}+r_{n-2}x^{n-2}+ \ldots +r_1x^1+r_0x^0$. In this case, a relationship of $x^nA(x)=Q(x)G(x)+R(x)$ is established. Here, $Q(x)$ is a polynomial equivalent to the quotient of division at an integral number. A bit string expressed in the elements $r_{n-1}, r_{n-2}, \ldots, r_1, r_0$ is generally called CRC code. The computation of determining the CRC code is generally called "CRC computation".

In the above $x^nA(x)=Q(x)G(x)+R(x)$, symbol + means an addition by a Galois field defined modulo 2 and is equivalent to exclusive Oring, i.e., XORing as viewed from a bit string. Thus, data expressed in the sign of the left side $x^nA(x)+R(x)$ at the time that $x^nA(x)+R(x)$ is expressed as equal to $Q(x)G(x)$, i.e., $x^nA(x)+R(x)=Q(x)G(x)$, that is, the data being expressed in $a_{m-1}, a_{m-2}, \ldots, a_1, a_0, r_{n-1}, r_{n-2}, \ldots, r_1, r_0$ is transmitted upon data transfer. This data is assumed to be $B(x)$ below.

When $(m,n)=(10,5)$, $A(x)=x^9+x^7+x^3+x^2+x^0$, and $G(x)=x^5+x^4+x^2+x^0$ as shown in FIG. 17 by way of example, $R(x)=x^3+x^2+x^1$ is established and hence transmit data results in $B(x)=x^{14}+x^{12}+x^8+x^7+x^5+x^3+x^2+x^1$.

On the receiving side, receive data is assumed to be $x^nA(x)+R(x)$ and a remainder at $G(x)$ is determined as a CRC check result. If no error exists upon the data transfer, then $x^nA(x)+R(x)$ is equal to $Q(x)G(x)$ and hence the CRC check result becomes 0. On the other hand, when an error $E(x)$ occurs upon the data transfer, the receive data can be expressed in the form of $x^nA(x)+R(x)+E(x)$ and hence the CRC check result does not reach 0.

As the conventional communication system that performs the CRC computation, there is known one wherein error detection dedicated to a frame header and error detection (FCS (frame check sequence)) for the whole reception frame are effected on each of reception frames on the receiving side, and wherein the individual reception frames are further brought into blocks and the result of calculation of a remainder based on a cyclic redundancy code set for each block is used in PCS, thereby attaining multiplexing of error detection and improving the accuracy of error detection (refer to, for example, Japanese Patent Laid-Open No. 2002-335229).

In the conventional communication system, $R(x)=0$ and $B(x)=0$ as shown in FIG. 18 where information data indicative of all 0 is transferred, i.e., $A(x)=0$. Thus, a problem arises in that in a system in which the frequencies on the transmitting and receiving sides are different from each other, an error cannot be detected even though one bit-shifted data is received, and the data is misjudged as proper data. This problem may take place where when, for example, CDR (Clock and Data Recovery) is used in a reception system, the frequency of a clock recovered by the CDR drifts as compared with the transmitting side.

When the error $E(x)$ is divided by $G(x)$, that is, when $E(x)$ can be expressed in the form of $E(x)=S(x)G(x)$ using an arbitrary polynomial $S(x)$, receive data containing the error $E(x)$ is expressed in the form of $x^nA(x)+R(x)+E(x)=Q(x)G(x)+S(x)G(x)=(Q(x)+S(x))G(x)$. Thus, a problem arises in that since a remainder at $G(x)$ becomes 0 as shown in FIG. 19, an error cannot be detected and the receive data is misjudged as proper data.

SUMMARY OF THE INVENTION

The present invention has been made to solve the above problems. A first object of the present invention is to obtain a communication system capable of detecting an error even when information data indicative of all 0 is transferred.

A second object of the present invention is to obtain a communication system capable of detecting an error even when an error is divided by a generator polynomial.

A communication system of the present invention comprises a transmitting device, and a receiving device. The transmitting device includes addition bit string connecting means for connecting an addition bit string containing at least one bit 1 to information data, CRC computing means for generating a CRC code corresponding to a remainder at a polynomial ring on a Galois field defined modulo 2 based on a predetermined generator polynomial of the information data connected with the addition bit string, and transmitting means for transmitting the information data connected with the CRC code. The receiving device includes receiving means for receiving the data transmitted from the transmitting means, addition bit string adding means for performing an addition of the received data and the addition bit string at a polynomial ring on a Galois field defined modulo 2, and CRC checking means for making a decision as to the presence or absence of a transmission error by determining the remainder at the polynomial ring on the Galois field defined modulo 2 based on the generator polynomial of data obtained by the addition bit string adding means.

According to the present invention, an error can be detected even when information data indicative of all 0 is transferred.

Other and further objects, features and advantages of the invention will appear more fully from the following description.

BRIEF DESCRIPTION OF THE DRAWINGS

FIGS. 5-10 are diagrams showing one example illustrative of respective data employed in the communication system shown in FIG. 4.

DETAILED DESCRIPTION OF THE PREFERRED EMBODIMENTS

First Embodiment

Figure 1:
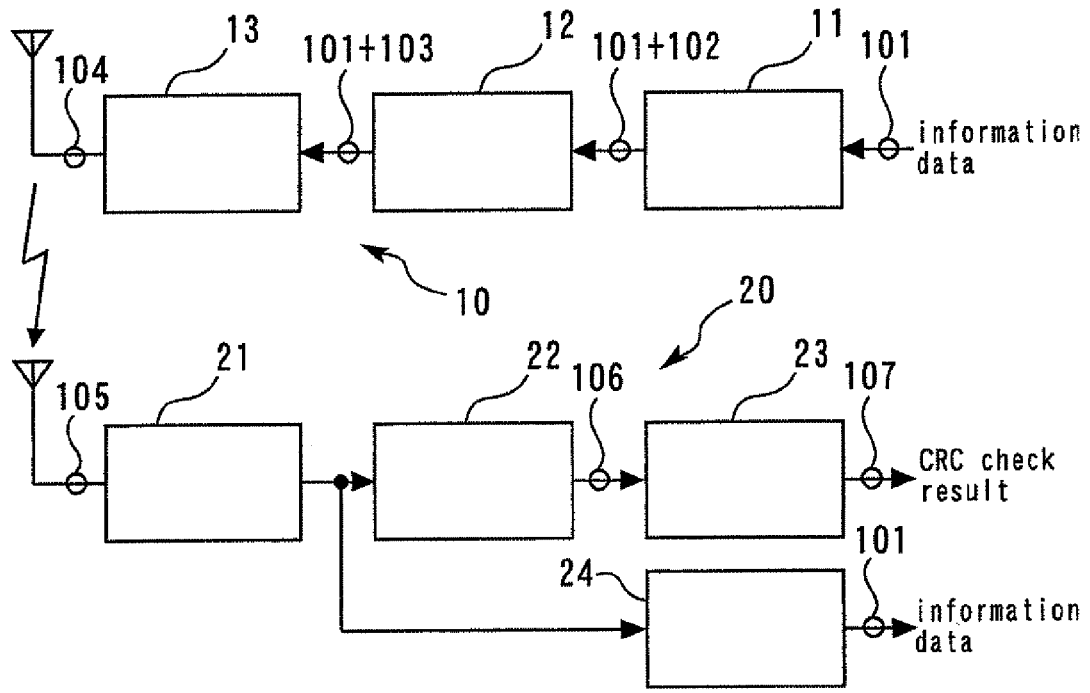
FIG. 1 is a block diagram showing a communication system according to a first embodiment of the present invention.
Figure 2:
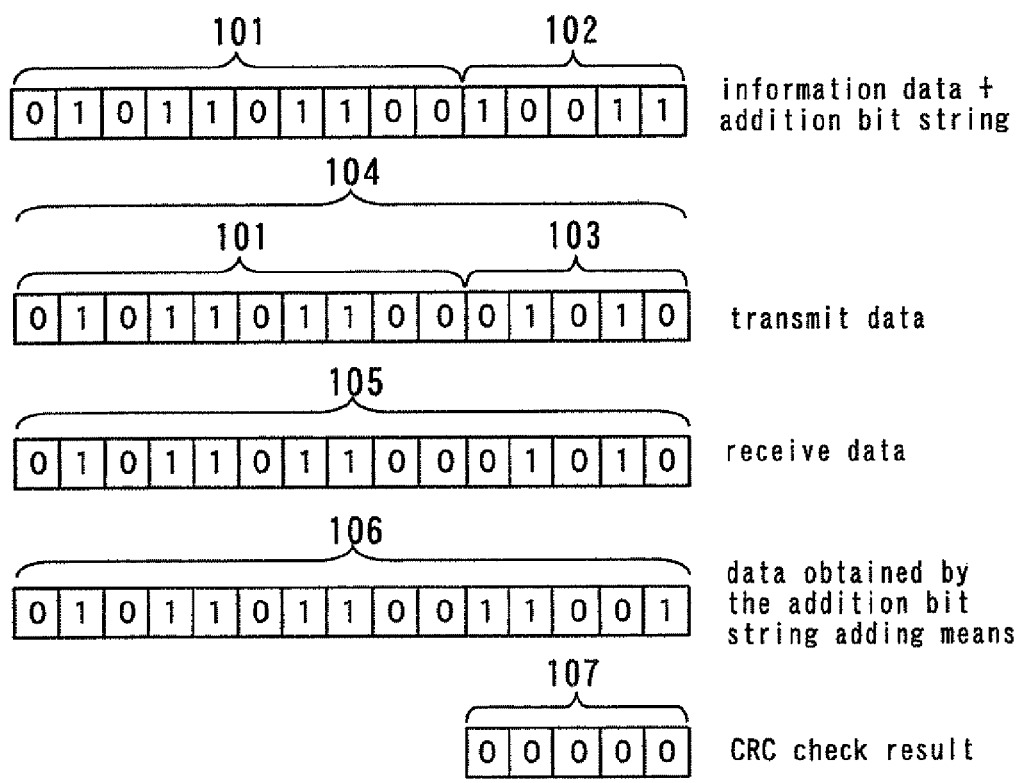
FIG. 2 is a diagram showing one example illustrative of respective data employed in the communication system shown in FIG. 1.

FIG. 1 is a block diagram showing a communication system according to a first embodiment of the present invention. FIG. 2 is a diagram showing one example illustrative of respective data employed in the communication system shown in FIG. 1.

The communication system comprises a transmitting device 10 and a receiving device 20. The transmitting device 10 is equipped with an addition bit string connecting means 11, a CRC computing means 12, and a transmitting means 13. On the other hand, the receiving device 20 is provided with a receiving means 21, an addition bit string adding means 22, a CRC verifying or checking means 23, and a separating means 24.

The operation of the communication system according to the present embodiment will next be explained. First, the addition bit string connecting means 11 connects an addition bit string 102 containing at least one bit 1 to information data 101.

Next, the CRC computing means 12 generates a CRC code 103 corresponding to a remainder at a polynomial ring on a Galois field defined modulo 2 based on a predetermined generator polynomial of the information data 101 connected with the addition bit string 102.

The transmitting means 13 transmits the information data 101 (transmit data 104) connected with the CRC code 103.

Next, the receiving means 21 receives therein data (receive data 105) transmitted from the transmitting means 13. The addition bit string adding means 22 performs an addition of the receive data 105 and the addition bit string 102 by the polynomial ring on the Galois field defined modulo 2.

Next, the CRC checking means 23 makes a decision as to the presence or absence of a transmission error by determining a remainder at a polynomial ring on a Galois field defined modulo 2 based on a predetermined generator polynomial of data 106 obtained by the addition bit string adding means 22. Described specifically, when a CRC check result 107 associated with the determined remainder is indicative of all 0, the CRC checking means 23 determines that no transmission error occurs.

On the other hand, the separating means 24 separates and fetches out the information data 101 from the receive data 105.

Let's now demonstrate that the communication system according to the present embodiment bears comparison with the conventional communication system in terms of error detection. It is assumed below that $\alpha$≡information data(order m), $\eta$≡addition bit string (order n), $\beta$≡receive data, $\delta$≡receive data (containing an error), $\delta=\beta+\epsilon E$, $\gamma$≡generator polynomial (order n), $\rho$=remainder (order n), $\epsilon$≡error (order m+n), and $\zeta$, $\xi$≡arbitrary polynomial. Here, $\eta \neq 0$ (the same as the conventional communication system if $\eta=0$). It is also assumed that when $\rho \equiv (\alpha \cdot x^n + \eta) \bmod \gamma$, $\beta = \alpha \cdot x^n + \rho = \gamma \cdot \xi$.

The CRC checking means 23 performs the following calculations.

$$(\delta + \eta) \bmod \gamma = (\beta + \varepsilon + \eta) \bmod \gamma$$
$$= (\alpha \cdot X^n + \rho + \varepsilon + \eta) \bmod \gamma$$
$$= (\alpha \cdot X^n + ((\alpha \cdot X^n + \eta) \bmod \gamma) + \varepsilon + \eta) \bmod \gamma$$
$$= \alpha \cdot X^n \bmod \gamma + ((\alpha \cdot X^n + \eta) \bmod \gamma) \bmod \gamma + \varepsilon \bmod \gamma + \eta \bmod \gamma$$
$$= \alpha \cdot X^n \bmod \gamma + ((\alpha \cdot X^n \bmod \gamma) \bmod \gamma + (\eta \bmod \gamma) \bmod \gamma + \varepsilon \bmod \gamma + \eta \bmod \gamma$$
$$= \alpha \cdot X^n \bmod \gamma + \alpha \cdot X^n \bmod \gamma + \eta \bmod \gamma + \varepsilon \bmod \gamma + \eta \bmod \gamma$$
$$= \varepsilon \bmod \gamma$$

Since the CRC check result is $\epsilon \bmod \gamma$ even in the conventional communication system, it can be the that the communication system according to the present embodiment bears comparison with the conventional communication system in terms of error detection. However, as with the conventional communication system, the communication system is not capable of detecting errors where $\epsilon = \gamma \cdot \xi$.

Figure 3:
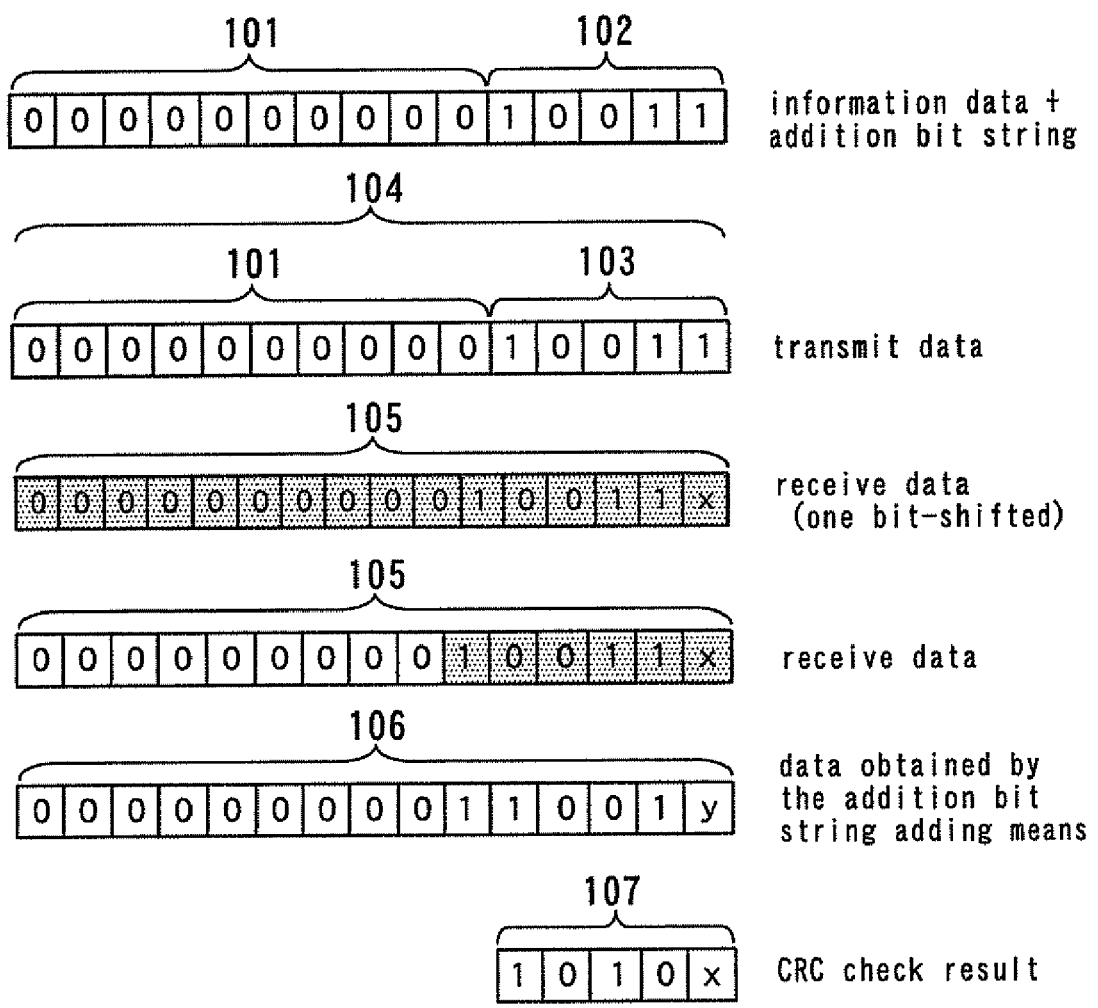
FIG. 3 is a diagram showing respective data employed in the communication system shown in FIG. 1 when the information data is expressed with all bits set to 0 and the addition bit string is 10011

Since $\eta \neq 0$, the communication system according to the present embodiment can prevent a continuity of 0. When the information data 101 is expressed with all bits set to 0 and the addition bit string 102 is 10011 as shown in FIG. 3, for example, bits 1 definitely appear in the CRC code 103.

Thus, since the addition bit string 102 is not expressed in the form of all 0 even though the transmit data 104 is shifted upon data reception, the result obtained by the CRC checking means 23 on the receiving side is not brought to all 0 and hence an error can be detected. Incidentally, x shown in FIG. 3 indicates 0 or 1, and y indicates the inversion of x.

Note that, since the above embodiment is merely illustrated by way of example, the code length of each data may not be the same as one referred to above. Although expressed in $x^6+x^4+x^2+x^0$, the generator polynomial may be another generator polynomial.

Second Embodiment

Figure 4:
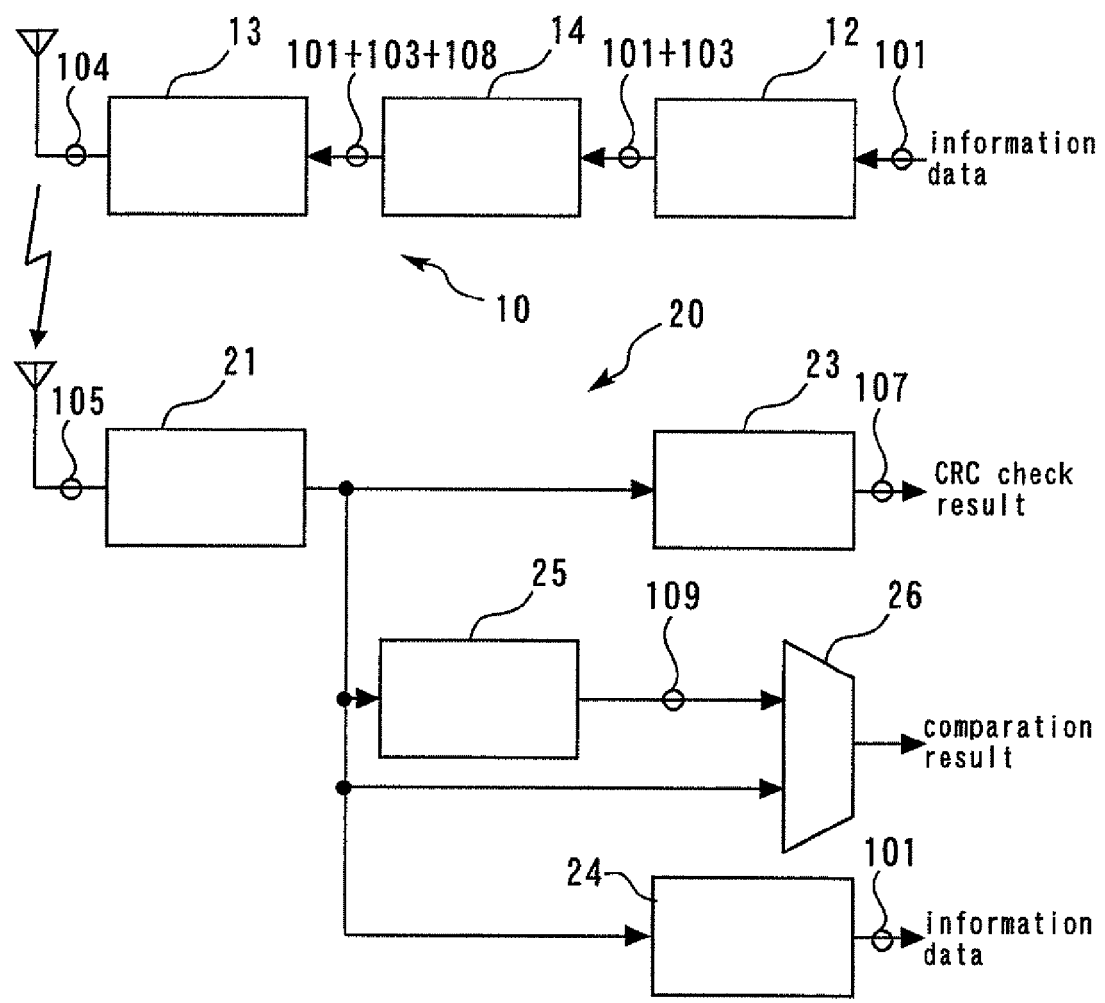
FIG. 4 is a block diagram showing a communication system according to a second embodiment of the present invention.
Figure 5:
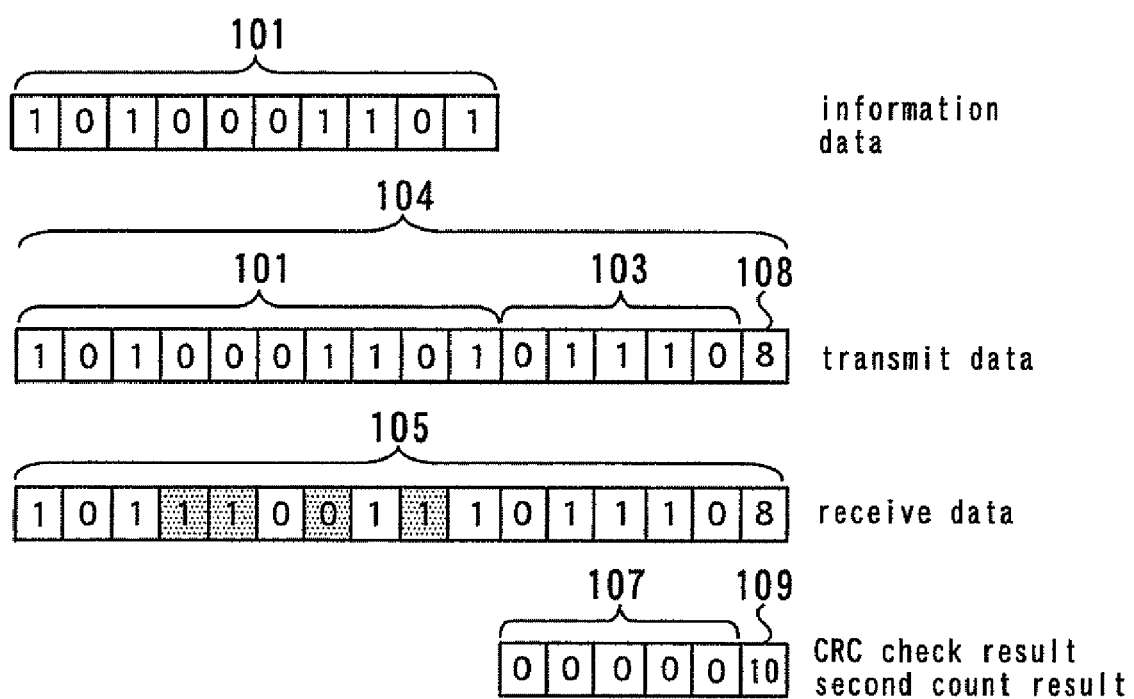

FIG. 4 is a block diagram showing a communication system according to a second embodiment of the present invention. Constituent elements similar to those shown in FIG. 1 are given the same reference numerals, and their explanations will be omitted. FIG. 5 is a diagram showing one example illustrative of respective data employed in the communication system shown in FIG. 4.

A transmitting device 10 is provided with a CRC computing means 12, a first counting means 14, and a transmitting means 13. On the other hand, a receiving device 20 is equipped with a receiving means 21, a second counting means 25, a comparing means 26, a CRC checking means 23, and a separating means 24.

The operation of the communication system according to the present embodiment will next be explained. First, the CRC computing means 12 generates a CRC code 103 corresponding to a remainder at a polynomial ring on a Galois field defined modulo 2 based on a predetermined generator polynomial of information data 101. Next, the first counting means 14 counts the number of bits 1 within the information data 101 and the CRC code 103 to thereby determine a first count result 108. The transmitting means 13 transmits the information data 101 (transmit data 104) connected with the CRC code 103 and the first count result 108.

Next, the receiving means 21 receives therein data (receive data 105) transmitted from the transmitting means 13. The CRC checking means 23 makes a decision as to the presence or absence of a transmission error by determining a remainder at the polynomial ring on the Galois field defined modulo 2 based on the predetermined generator polynomial of the information data 101 connected with the received CRC code 103.

The second counting means 25 counts the number of bits 1 lying in the received information data 101 and CRC code 103 to thereby determine a second count result 109. The comparing means 26 compares the received first and second count results 108 and 109 and makes a decision as to the presence or absence of a transmission error from the comparison thereof.

Incidentally, the first counting means 14 and the second counting means 25 may respectively adopt-values subjected to some computations on the basis of the number of 1s or 0s in place of the number of bits 1 as the first count result 108 and the second count result 109.

According to the present embodiment, the CRC checking means 23 makes the error-free decision where the information data indicative of all 0 is transferred and the error is divided by the generator polynomial. Since, however, the received first count result 108 and second count result 109 are different in value from each other, the error can be detected.

In FIG. 6, the length of information data 101+CRC code 103 is 8 bits=$2^3$. The lengths of the first recognition result 108 (and the second recognition result 109) are 3 bits respectively. This is equivalent to the case in which assuming that n is a whole number, the length of the information data 101+CRC code 103 intended for error detection is $2^n$, and the length of the first recognition result 108 is n. In this case, the first recognition result 108 cannot represent a state in which the information data 101 and the CRC code 103 are all 0. Thus, as shown in FIG. 7, the length of the first recognition result 108 is incremented by 1, and an all-0 expression bit indicative of the case in which the information data 101 and the CRC code 103 are all 0, is allocated. The all-0 expression bit is set to, for example, "1" when the information data 101 and the CRC code 103 are all 0 and "0" when other than the above. Thus, since the first recognition result 108 can express the state of all 0, an error can be detected.

In FIG. 8, the length of the information data 161+CRC code 103 is 7 bits, and the length of the first recognition result 108 is 3 bits. Assuming that in this case, the length of the information data 101+CRC code 103 is m, the length of the first recognition result 108 exceeds $\log_2 m$. Thus, the first recognition result 108 can express a state of all 0. When the length of the information data 101+CRC code 103 is 8 bits as shown in FIG. 9, the length of the first recognition result 108 is set to a value exceeding $\log_2 8=3$ bits, for example, 4 bits. Thus, the first recognition result 108 can express a state of all 0.

As shown in FIG. 10, one state other than all 0, and the state of all 0 are set to the same code in the first recognition result 108, With the length of the first recognition result 108 as $\log_2 8=3$ bits, for example, the first recognition result 108 is set to "111" in a state in which the number of 1 included in the information data 101 and CRC code 103 is 1 and all 0. Thus, although the state of all 0 cannot be specified, an error can be detected.

Third Embodiment

Figure 11:
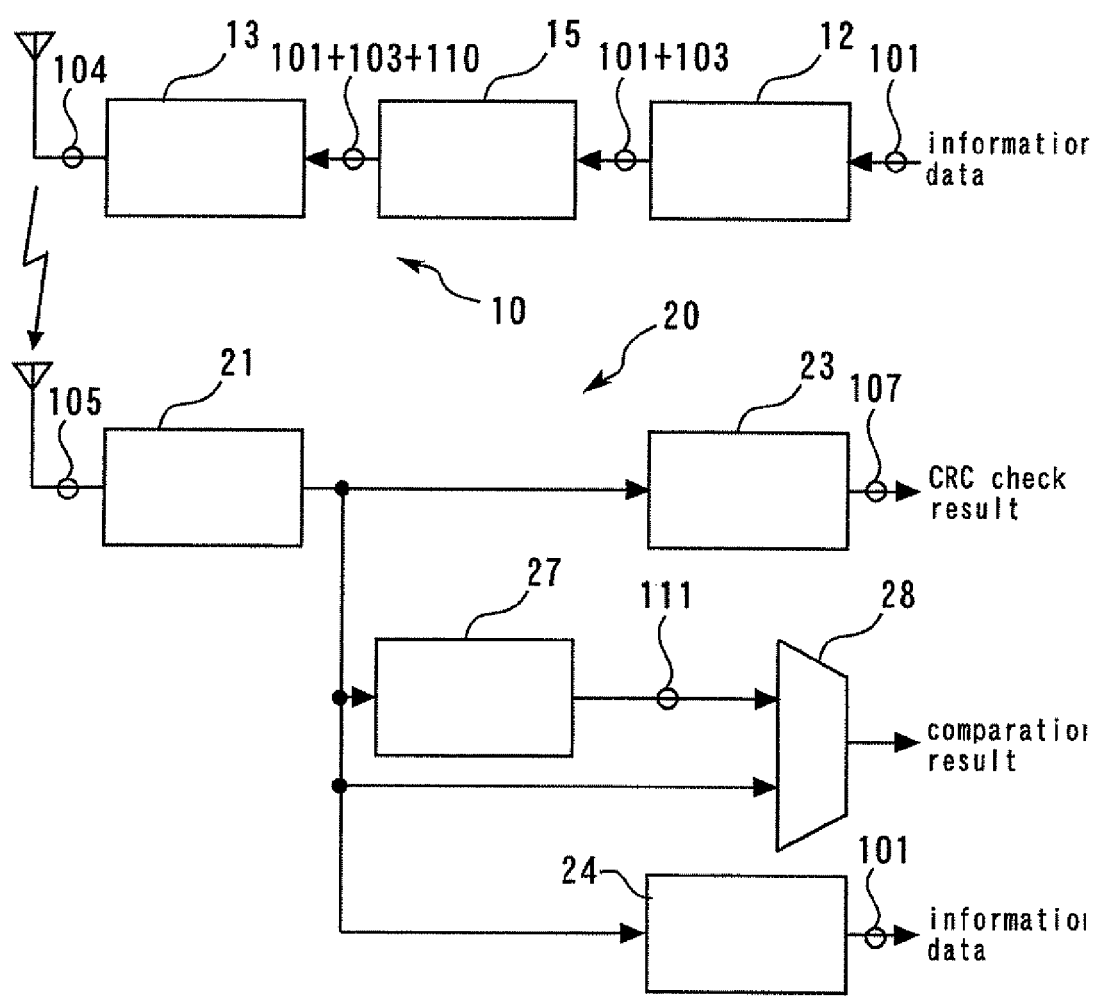
FIG. 11 is a block diagram showing a communication system according to a third embodiment of the present invention.
Figure 12:
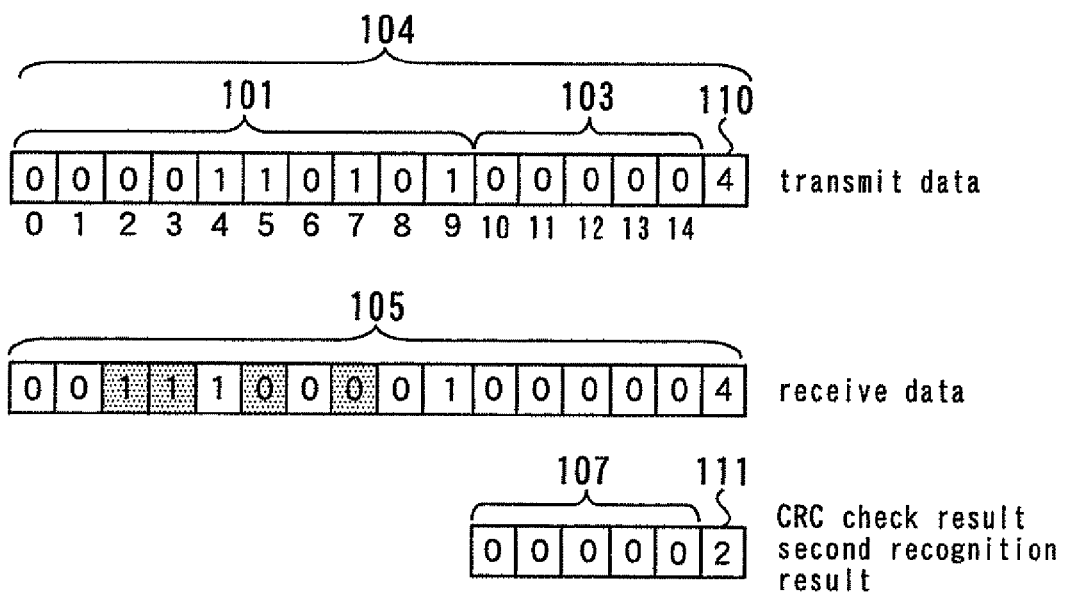
FIG. 12 is a diagram showing one example illustrative of respective data employed in the communication system shown in FIG. 11.

FIG. 11 is a block diagram showing a communication system according to a third embodiment of the present invention. Constituent elements similar to those shown in FIGS. 1 and 4 are given the same reference numerals, and their explanations will be omitted. FIG. 12 is a diagram showing one example illustrative of respective data employed in the communication system shown in FIG. 11.

A transmitting device 10 is provided with a CRC computing means 12, a first spot identifying means 15, and a transmitting means 13. On the other hand, a receiving device 20 is equipped with a receiving means 21, a second spot identifying means 27, a comparing means 28, a CRC checking means 23, and a separating means 24.

The operation of the communication system according to the present embodiment will next be explained. First, the CRC computing means 12 generates a CRC code 103 corresponding to a remainder at a polynomial ring on a Galois field defined modulo 2 based on a predetermined generator polynomial of information data 101. Next, the first spot identifying means 15 identifies or recognizes a spot where a bit 1 first appears within each of the information data 101 and the CRC code 103 to thereby determine a first recognition result 110. The transmitting means 13 transmits the information data 101 (transmit data 104) connected with the CRC code 103 and the first recognition result 110.

Next, the receiving means 21 receives therein data (receive data 105) transmitted from the transmitting means 13. The second spot identifying means 27 recognizes a spot where a bit 1 first appears within each of the received information data 101 and CRC code 103 to thereby determine a second recognition result 111. The comparing means 28 compares the first recognition result 110 and the second recognition result 111 both received therein and thereby makes a decision as to the presence or absence of a transmission error.

Incidentally, the first spot identifying means 15 and the second spot identifying means 27 may respectively adopt values subjected to some computations on the basis of the number of is or 0s in place of the number of bits 1 as the first recognition result 110 and the second recognition result 111.

According to the present embodiment, the CRC checking means 23 makes the error-free decision where the information data indicative of all 0 is transferred and the error is divided by the generator polynomial. Since, however, the first recognition result 110 and the second recognition result 111 are different in value from each other, the error can be detected.

Assuming that the length of the information data 101+CRC code 103 is m in a manner similar to FIGS. 7 through 9 illustrative of the second embodiment, the lengths of the first recognition result 110 (and the second recognition result 111) are set so as to exceed $\log_2$ m. Thus, the first recognition result 110 can represent the state of all 0.

In a manner similar to FIG. 10 illustrative of the second embodiment, one state other than all 0, and the state of all 0 are set to the same code in the first recognition result 110. Thus, although the state of all 0 cannot be specified, an error can be detected.

Fourth Embodiment

Figure 13:
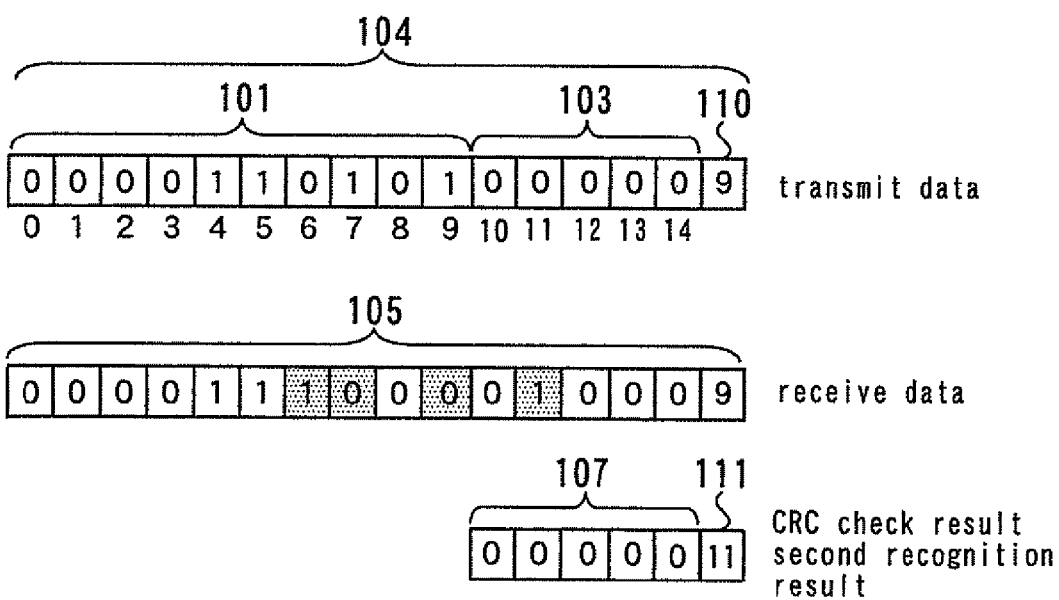
FIG. 13 is a diagram showing one example illustrative of each data employed in the communication system according to a fourth embodiment of the present invention.

A communication system according to the present embodiment is different from the third embodiment in terms of the functions of a first spot identifying means 15 and a second spot identifying means 27. That is, the first spot identifying means 15 recognizes or identifies a spot where a bit 1 first appears within each of a CRC code 103 and information data 101 to thereby obtain a first recognition result 110. Further, the second spot identifying means 27 recognizes or identifies a spot where a bit 1 finally appears within each of the received CRC code 103 and information data 101 to thereby obtain a second recognition result 111. The other configurations of the present embodiment are similar to those of the third embodiment. FIG. 13 is a diagram showing one example illustrative of each data employed in the communication system according to the present embodiment.

As with the third embodiment, according to the present embodiment, an error can be detected even when information data indicative of all 0 is transferred and the error is divided by a generator polynomial.

Assuming that the length of the information data 101+CRC code 103 is m in a manner similar to FIGS. 7 through 9 illustrative of the second embodiment, the lengths of the first recognition result 110 (and the second recognition result 111) are set so as to exceed $\log_2$ m. Thus, the first recognition result 110 can express the state of all 0.

In a manner similar to FIG. 10 illustrative of the second embodiment, one state other than all 0, and the state of all 0 are set to the same code in the first recognition result 110. Thus, although the state of all 0 cannot be specified, an error can be detected.

Fifth Embodiment

Figure 14:
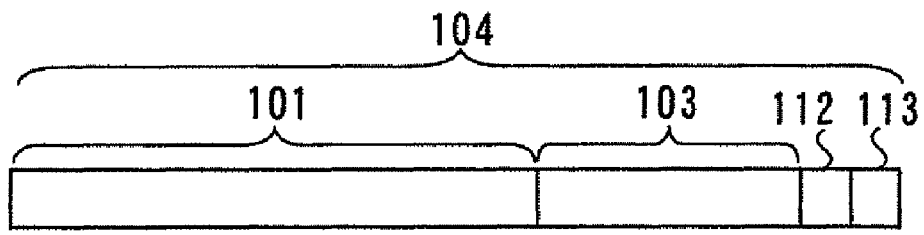
FIG. 14 is a diagram showing data transmitted by the transmitting device according to a fifth embodiment of the present invention.

The present embodiment is a combination of any two of the second through fourth embodiments. Thus, as shown in FIG. 14, the transmit data 104 transmitted by the transmitting device 10 results in one obtained by connecting the CRC code 103 and codes 112 and 113 to the information data 101. The code 112 indicates either the first count result 108 of the second embodiment, the first recognition result 110 of the third embodiment or the first recognition result 110 of the fourth embodiment, whereas the code 113 indicates another one.

When the second and third embodiments are combined together, an error can be detected even when the number of bits 1 remains unchanged regardless of an error's addition and even when spots where bits 1 first appear coincide with each other regardless of an error's addition.

When the second and fourth embodiments are combined together, an error can be detected even when the number of bits 1 remains unchanged regardless of an error's addition and even when spots where bits 1 appear finally coincide with each other regardless of an error's addition.

When the third and fourth embodiments are utilized in combination, an error can be detected even when spots where bits 1 first appear coincide with each other regardless of an error's addition and even when spots where bits 1 appear finally coincide with each other regardless of an error's addition.

Sixth Embodiment

Figure 15:
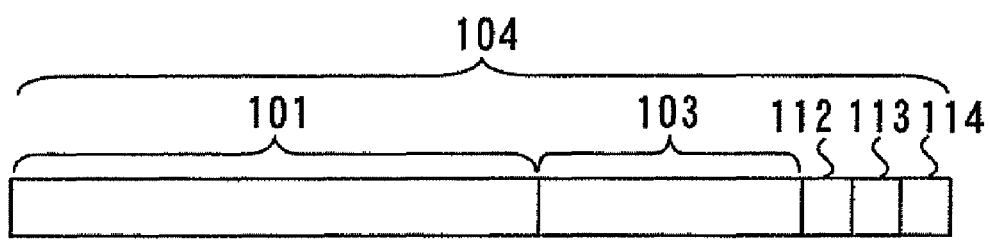
FIG. 15 is a diagram showing data transmitted by the transmitting device according to a sixth embodiment of the present invention.

The present embodiment is a combination of the second through fourth embodiments. Thus, as shown in FIG. 15, the transmit data 104 transmitted by the transmitting device 10 results in one obtained by connecting the CRC code 103 and codes 112 through 114 to the information data 101. The code 112 indicates either the first count result 108 of the second embodiment, the first recognition result 110 of the third embodiment or the first recognition result 110 of the fourth embodiment, whereas the code 113 indicates another one and the code 114 indicates the remaining one.

Thus, an error can be detected even when the number of bits 1 remains unchanged, spots where bits 1 first appear coincide with each other and spots where bits 1 appear finally coincide with each other, regardless of an error's addition.

Seventh Embodiment

Figure 16:
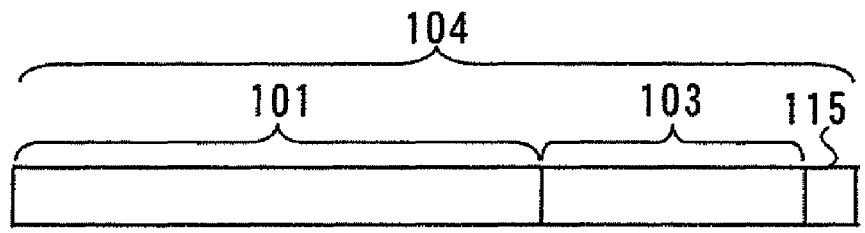
FIG. 16 is a diagram showing data transmitted by the transmitting device according to a seventh embodiment of the present invention.
Figure 17:
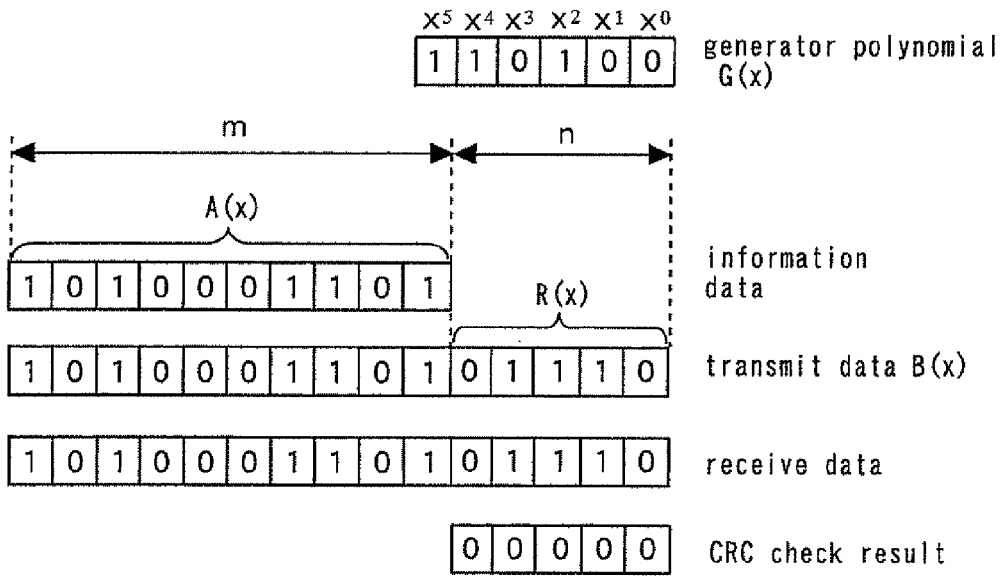
FIG. 17 is a diagram showing one example illustrative of respective data employed in the conventional communication system.
Figure 18:
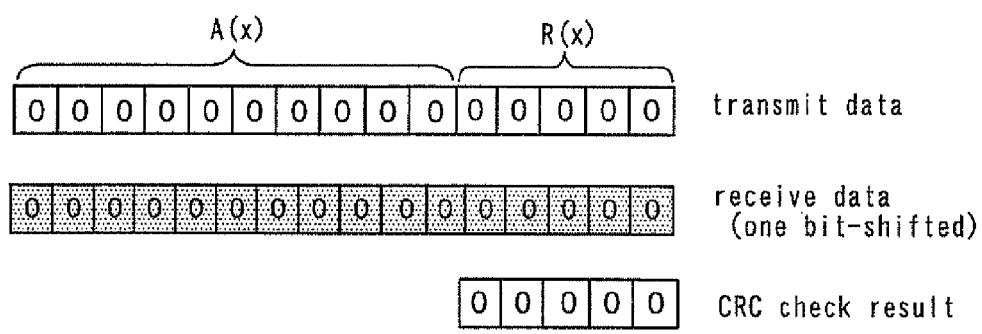
FIG. 18 is a diagram showing one example illustrative of respective data employed in the conventional communication system when the information data is expressed with all bits set to 0.
Figure 19:
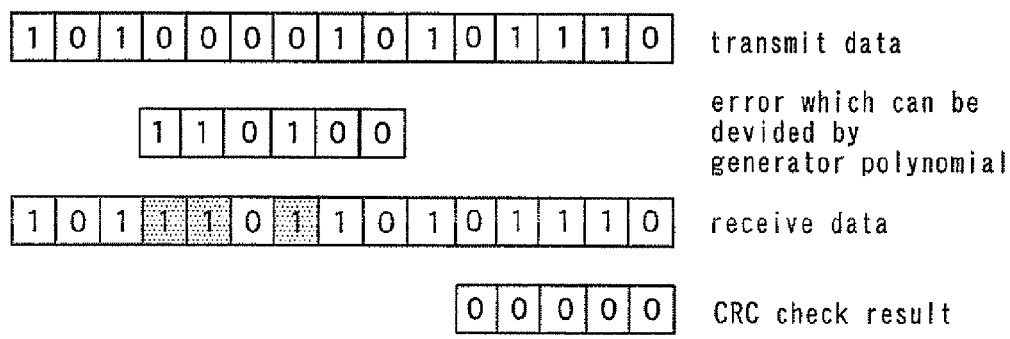
FIG. 19 is a diagram showing one example illustrative of respective data employed in the conventional communication system when an error is divided by a generator polynomial when an error is divided by a generator polynomial.

In a communication system according to the present embodiment, transmit data 104 transmitted by a transmitting device 10 is assumed to be one obtained by connecting a CRC code 103 and a code 115 to information data 101 as shown in FIG. 16. The code 115 indicates a value equivalent to the sum of any two or three of the first count result 108 of the second embodiment, the first recognition result 110 of the third embodiment and the first recognition result 110 of the fourth embodiment. However, a value subjected to some computations without taking the total value may be adopted as the code 115.

Assuming that the range of the values for the first count result 108 of the second embodiment, the first recognition result 110 of the third embodiment or the first recognition result 110 of the fourth embodiment extends from 0 to 8 in the case of the sixth embodiment, the range extends from 0000 to 1000 in binary notation. Therefore, each range is set four bits by four bits and hence 12 bits in total are needed. On the other hand, in the present embodiment, the range of the values extends from 0 to 24 by taking the sum of these values and further extends from 00000 to 11000 in binary notation, thus making it possible to reduce the number of bits to 6 bits.

Eighth Embodiment

The present embodiment provides a system for connecting dummy data to information data even other than the CRC code. In the present system, any of the first count result 108 of the second embodiment, the first recognition result 110 of the third embodiment, the first recognition result 110 of the fourth embodiment, and the codes 112 through 115 is connected to the dummy data. Thus, the present embodiment brings about an advantageous effect similar to each of the second through seventh embodiments.

The present embodiment can be applied to, for example, a system wherein when a host of an optical transceiver writes information data connected with a CRC code into an optical module, the host feeds back dummy data CAB (CRC Add-on Byte) following the result of checking by a CRC (e.g., XFP Rev, 4.0 with addition of nomenclature for 10 GBASE-LRM and G, 959.1 PlL1-2D2).

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-249443, filed on Sep. 14, 2006 including specification, claims, drawings and summary, on which the Convention priority of the present application is based, are incorporated herein by reference in its entirety.

What is claimed is:

1. A communication system comprising:
a transmitting device; and
a receiving device, wherein
    the transmitting device includes,
        addition bit string connecting means for connecting an addition bit string containing at least one bit 1 to information data,
        CRC computing means for generating a CRC code corresponding to a remainder at a polynomial ring on a Galois field defined modulo 2 based on a predetermined generator polynomial of the information data connected with the addition bit string, and
        transmitting means for transmitting the information data connected with the CRC code, and
    the receiving device includes
        receiving means for receiving the data transmitted from the transmitting means,
        addition bit string adding means for performing an addition of the data received and the addition bit string at a polynomial ring on a Galois field defined modulo 2, and
        CRC checking means for making a decision as to presence or absence of a transmission error by determining the remainder at the polynomial ring on the Galois field defined modulo 2 based on the generator polynomial of data obtained by the addition bit string adding means.

2. A communication system comprising:
a transmitting device; and
a receiving device, wherein
    the transmitting device includes
        CRC computing means for generating a CRC code corresponding to a remainder at a polynomial ring on a Galois field defined modulo 2 based on a predetermined generator polynomial of information data,
        first counting means for counting the number of bits 1 or 0 lying within the information data and the CRC code to determine a first count result, and
        transmitting means for transmitting the information data connected with the CRC code and the first count result, and
    the receiving device includes
        receiving means for receiving the data transmitted from the transmitting means,
        CRC checking means for making a decision as to presence or absence of a transmission error by determining the remainder at the polynomial ring on the Galois field defined modulo 2 based on the generator polynomial of the information data connected with the CRC code received,
        second counting means for counting the number of bits 1 or 0 lying within the received information data and CRC code to determine a second count result, and
        comparing means for comparing the first count result and the second count result received therein to make a decision as to the presence or absence of a transmission error.

3. A communication system comprising:
a transmitting device; and
a receiving device, wherein
    the transmitting device includes
        CRC computing means for generating a CRC code corresponding to a remainder at a polynomial ring on a Galois field defined modulo 2 based on a predetermined generator polynomial of information data,
        first identifying means for recognizing a spot where a bit 1 first appears within each of the information data and the CRC code, to determine a first recognition result, and
        transmitting means for transmitting the information data connected with the CRC code and the first recognition result, and
    the receiving device includes
        receiving means for receiving the data transmitted from the transmitting means,
        CRC checking means for making a decision as to presence or absence of a transmission error by determining the remainder at the polynomial ring on the Galois field defined modulo 2 based on the generator polynomial of the information data connected with the code received,
        second identifying means for recognizing a spot where a bit 1 first appears within each of the received information data and CRC code, to determine a second recognition result, and
        comparing means for comparing the first recognition result and the second recognition result to make a decision as to the presence or absence of a transmission error.

4. A communication system comprising:
a transmitting device; and
a receiving device, wherein
    the transmitting device includes
        CRC computing means for generating a CRC code corresponding to a remainder at a polynomial ring on a Galois field defined modulo 2 based on a predetermined generator polynomial of information data,
        first identifying means for recognizing a spot where a bit 1 finally appears within each of the information data and the CRC code, to determine a first recognition result, and
        transmitting means for transmitting the information data connected with the CRC code and the first recognition result, and
    the receiving device includes
        receiving means for receiving the data transmitted from the transmitting means,
        CRC checking means for making a decision as to presence or absence of a transmission error by determining the remainder at the polynomial ring on the Galois field defined modulo 2 based on the generator polynomial of the information data connected with the CRC code received, second identifying means for recognizing a spot where a bit 1 finally appears within each of the received information data and CRC code, to determine a second recognition result, and comparing means for comparing the first recognition result and the second recognition result to make a decision as to the presence or absence of a transmission error.

5. The communication system according to claim 2, wherein, assuming that length of the information data plus length of the CRC code is m, lengths of the first and second recognition results are set so as to exceed log 2m.

6. The communication system according to claim 3, wherein, assuming that length of the information data plus length of the CRC code is m, lengths of the first and second recognition results are set so as to exceed log 2m.

7. The communication system according to claim 4, wherein, assuming that length of the information data plus length of the CRC code is m, lengths of the first and second recognition results are set so as to exceed log 2m.

8. The communication system according to claim 2, wherein, in the first and second recognition results, one state other than all 0, and a state of all 0 are set to the same code.

9. The communication system according to claim 3, wherein, in the first and second recognition results, one state other than all 0, and a state of all 0 are set to the same code.

10. The communication system according to claim 4, wherein, in the first and second recognition results, one state other than all 0, and a state of all 0 are set to the same code.

* * * * *